United States Patent
Hsu et al.

(10) Patent No.: US 10,886,320 B2
(45) Date of Patent: *Jan. 5, 2021

(54) MECHANISMS FOR FORMING IMAGE-SENSOR DEVICE WITH EPITAXIAL ISOLATION FEATURE

(71) Applicant: Taiwan Semiconductor Manufacturing Co., Ltd., Hsin-Chu (TW)

(72) Inventors: Wen-I Hsu, Tainan (TW); Feng-Chi Hung, Chu-Bei (TW); Chun-Chieh Chuang, Tainan (TW); Dun-Nian Yaung, Taipei (TW); Jen-Cheng Liu, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/387,989

(22) Filed: Apr. 18, 2019

(65) Prior Publication Data

US 2019/0244990 A1    Aug. 8, 2019

Related U.S. Application Data

(63) Continuation of application No. 15/718,061, filed on Sep. 28, 2017, now Pat. No. 10,276,622, which is a
(Continued)

(51) Int. Cl.
*H01L 27/146* (2006.01)

(52) U.S. Cl.
CPC ...... *H01L 27/1464* (2013.01); *H01L 27/1463* (2013.01); *H01L 27/14689* (2013.01); *H01L 27/14643* (2013.01)

(58) Field of Classification Search
CPC ............ H01L 27/1463; H01L 27/1464; H01L 27/1462; H01L 27/14601
See application file for complete search history.

(56) References Cited

U.S. PATENT DOCUMENTS

| | | | |
|---|---|---|---|
| 5,134,090 A * | 7/1992 | Bean ................. | H01L 21/76294 117/105 |
| 9,780,137 B2 * | 10/2017 | Hsu ..................... | H01L 27/1464 |

(Continued)

FOREIGN PATENT DOCUMENTS

| KR | 100654056 B1 | 11/2006 |
|---|---|---|
| KR | 20120043441 A | 5/2012 |

OTHER PUBLICATIONS

Non-Final Office Action dated Jun. 19, 2015 for U.S. Appl. No. 14/089,263.
(Continued)

*Primary Examiner* — Alia Sabur
(74) *Attorney, Agent, or Firm* — Eschweiler & Potashnik, LLC

(57) ABSTRACT

An image-sensor device includes a substrate including a pixel region and a logic region. A logic transistor is disposed in the logic region and is surrounded by a logic isolation feature. A radiation-sensing region is disposed in the pixel region of the substrate. An epitaxial pixel isolation feature is disposed in the pixel region and surrounds the radiation-sensing region. A doped region with a same doping polarity as the radiation-sensing region is located between a bottom of the radiation-sensing region and the back surface of the substrate. The epitaxial pixel isolation feature is in direct contact with the doped region. The doped region extends continuously under the pixel region and the logic region. The epitaxial pixel isolation feature is in direct contact with the doped region, and the logic isolation feature is spaced apart from the doped region.

20 Claims, 9 Drawing Sheets

Related U.S. Application Data continuation of application No. 14/089,263, filed on Nov. 25, 2013, now Pat. No. 9,780,137.

(56) References Cited

U.S. PATENT DOCUMENTS

| | | | |
|---|---|---|---|
| 10,276,622 B2* | 4/2019 | Hsu | H01L 27/1464 |
| 2006/0006444 A1 | 1/2006 | Leslie | |
| 2008/0217720 A1 | 9/2008 | Fan et al. | |
| 2009/0200585 A1* | 8/2009 | Nozaki | H01L 27/1464 |
| | | | 257/292 |
| 2009/0200587 A1 | 8/2009 | Venezia et al. | |
| 2009/0200590 A1 | 8/2009 | Mao et al. | |
| 2010/0270636 A1* | 10/2010 | Huang | H01L 27/14627 |
| | | | 257/432 |
| 2011/0266645 A1 | 11/2011 | Chao | |
| 2012/0098078 A1* | 4/2012 | Shim | H01L 27/1464 |
| | | | 257/432 |
| 2012/0261670 A1* | 10/2012 | Marty | H01L 27/1463 |
| | | | 257/72 |
| 2012/0261784 A1 | 10/2012 | Roy et al. | |
| 2013/0089963 A1 | 4/2013 | Mishima et al. | |
| 2013/0099291 A1 | 4/2013 | Shimotsusa et al. | |
| 2013/0299886 A1* | 11/2013 | Chuang | H01L 27/14623 |
| | | | 257/292 |

OTHER PUBLICATIONS

Final Office Action dated Oct. 19, 2015 for U.S. Appl. No. 14/089,263.
Non-Final Office Action dated Jan. 14, 2016 for U.S. Appl. No. 14/089,263.
Final Office Action dated Jul. 28, 2016 for U.S. Appl. No. 14/089,263.
Non-Final Office Action dated Dec. 13, 2016 for U.S. Appl. No. 14/089,263.
Notice of Allowance dated Jun. 1, 2017 for U.S. Appl. No. 14/089,263.
Non-Final Office Action dated Aug. 3, 2018 for U.S. Appl. No. 15/718,061.
Notice of Allowance dated Feb. 6, 2019 for U.S. Appl. No. 15/718,061.

* cited by examiner

MECHANISMS FOR FORMING IMAGE-SENSOR DEVICE WITH EPITAXIAL ISOLATION FEATURE

REFERENCE TO RELATED APPLICATIONS

This Application is a Continuation of U.S. application Ser. No. 15/718,061, filed on Sep. 28, 2017, which is a Continuation of U.S. application Ser. No. 14/089,263, filed on Nov. 25, 2013 (now U.S. Pat. No. 9,780,137, issued on Oct. 3, 2017). The contents of the above-referenced Patent Applications are hereby incorporated by reference in their entirety.

BACKGROUND

An image-sensor device is one of the building blocks in a digital imaging system such as a digital still or a video camera. An image-sensor device includes a pixel array (or grid) for detecting light and recording intensity (brightness) of the detected light. The pixel array responds to the light by accumulating a charge—for example, the more light, the higher the charge. The accumulated charge is then used (for example, by other circuitry) to provide a color and brightness signal for use in a suitable application, such as a digital camera. One type of image sensor is a backside illuminated (BSI) image sensor device. BSI image sensor devices are used for sensing a volume of light projected towards a backside surface of a substrate (which supports the image sensor circuitry of the BSI image sensor device). The pixel grid is located at a front side of the substrate, and the substrate is thin enough so that light projected towards the backside of the substrate can reach the pixel grid. BSI image sensor devices provide a reduced destructive interference, as compared to front-side illuminated (FSI) image sensor device.

Integrated circuit (IC) technologies are constantly being improved. Such improvements frequently involve scaling down device geometries to achieve lower fabrication costs, higher device integration density, higher speeds, and better performance. Along with the advantages realized from reducing geometry size, improvements are being directly to the IC devices. One such IC device is an image sensor device.

Due to device scaling, improvements to BSI technology are continually being made to further improve the quality of BSI image sensor devices. Although existing BSI image-sensor devices and methods of fabricating BSI image sensor devices have been generally adequate for their intended purposes, as device scaling-down continues, they have not been entirely satisfactory in all respects.

BRIEF DESCRIPTION OF THE DRAWING

For a more complete understanding of the present disclosure, and the advantages thereof, reference is now made to the following descriptions taken in conjunction with the accompanying drawings.

DETAILED DESCRIPTION

Figure 1:
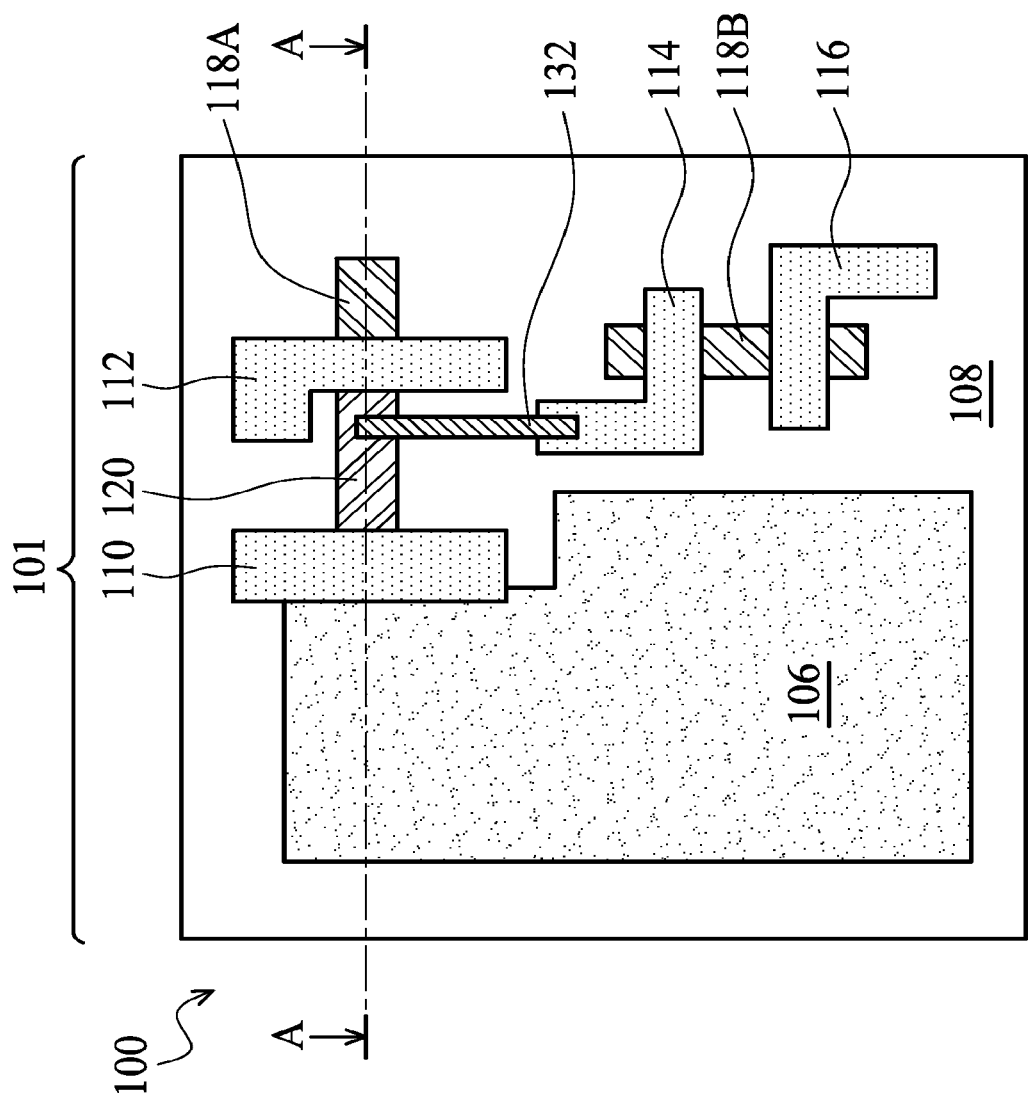
FIG. 1 shows an enlarged top view of a pixel region of an image-sensor device, in accordance with some embodiments.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact. In addition, the like elements in various figures and embodiments are identified by the same or similar reference numerals.

FIG. 1 shows an enlarged top view of a pixel region 101 of an image-sensor device 100, in accordance with some embodiments. The image-sensor device 100 includes an array of pixels shown in FIG. 1. Each pixel region 101 is arranged into a column and a row. The pixel region 101 refers to a unit cell containing one photodetector 106 and various circuitry for converting electromagnetic radiation to an electrical signal. In some embodiments, the photodetector 106 includes a photodiode for recording an intensity or brightness of radiation (light). The pixel region 101 may contain various transistors including a transfer transistor 110, a reset transistor 112, a source-follower transistor 114, a select transistor 116, other suitable transistors, or combinations thereof. The pixel region 101 may also include various doped regions in the substrate, for example doped regions 118A, 118B and 120. The doped regions (118A, 118B and 120) are configured as source/drain regions of previous mentioned transistors. The doped region 120 is also referred to as a floating diffusion region, which is between the transfer transistor 110 and the reset transistor 112. A conductive feature 132 overlaps a portion of a gate stack of the source-follower transistor 114 and connects to the floating diffusion region. The image-sensor device 100 also includes various isolation features formed in a substrate to isolate various regions of the substrate. In some embodiments, a dielectric isolation feature 108 is formed in the pixel region to isolate the photodetector 106, the transfer transistor 110, the reset transistor 112, the source-follower transistor 114 and the select transistor 116. Additional circuitry, input, and/or output in a periphery region may be coupled to the pixel array to provide an operation environment for the pixel region 101 and support external communications with the pixel region 101. For example, the pixel array may be coupled with readout circuitry and/or control circuitry in the periphery region.

Figure 2:
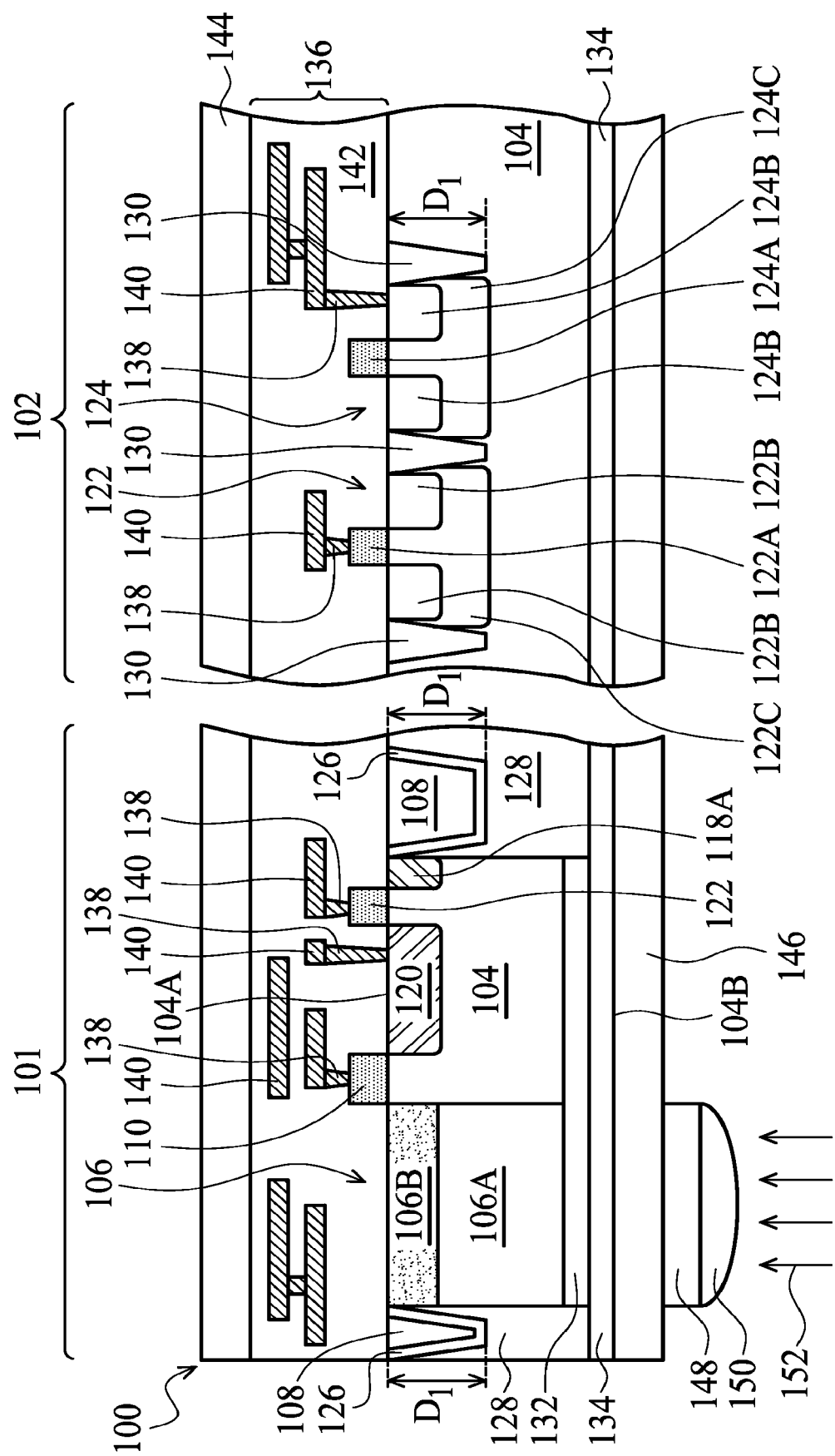
FIG. 2 shows a cross-sectional view of a pixel region shown in FIG. 1 and a periphery region of the image sensor device, in accordance with some embodiments.

FIG. 2 shows a cross-sectional view of the pixel region 101 along line A-A in FIG. 1 and a periphery region 102 of the image-sensor device 100, in accordance with some embodiments. The image-sensor device 100 includes a substrate 104 having a front surface 104A and a back surface 104B. In some embodiments, the substrate 104 is a semiconductor substrate including silicon. Alternatively or additionally, the substrate 104 includes another elementary semiconductor, such as germanium and/or diamond, a compound semiconductor including silicon carbide, gallium arsenic, gallium phosphide, indium arsenide and/or indium antimonide, an alloy semiconductor including SiGe, GaAsP, AnnAs, AlGaAs, GaInAs, GaInP, and/or GaInAsP, or combinations thereof. The substrate 104 may be doped with a p-type or n-type dopant. The P-type dopant includes boron, $BF_2$, gallium, indium, other suitable p-type dopants, or combinations thereof. The N-type dopant includes phosphorous, arsenic, other suitable n-type dopants, or combinations thereof. In the depicted embodiments, the substrate 104 is a p-type substrate. The substrate 104 may have a doping concentration ranging from about $1E15/cm^3$ to about $5E16/cm^3$. The substrate 104 may be implanted using a process such as in-situ doping, ion implantation or diffusion in various steps and techniques.

The pixel region 101 includes one or more photodetectors 106, such as a photodiode. As shown in FIG. 2, the photodetector 106 includes a radiation-sensing region 106A and a pinned layer 106B. The radiation-sensing region 106A is a doped region having a doping polarity which is different from that of the substrate 104, along the front surface 104A of the substrate 104. In the depicted embodiments, the radiation-sensing region 106A is an n-type doped region. The pinned layer 106B is a doped region layer disposed overlapping the radiation-sensing region 106A at the front surface 104A of the substrate 104. In the depicted embodiments, the pinned layer 106B is a p-type doped layer.

The pixel region 101 further includes various transistors, such as the transfer transistor 110, the reset transistor 112, the source-follower transistor 114 (shown in FIG. 1) and the select transistor 116 (shown in FIG. 1). Each transistor has a corresponding gate stack disposed over the front surface 104A of the substrate 104. The gate stack of the transfer transistor 110 overlies a portion of the radiation-sensing region 106A. The pixel region 101 also includes various doped regions in the substrate 104. The doped regions correspond to gate stacks of previous mentioned transistors as source/drain regions. For example, doped regions 120 and 118A are source/drain regions of the reset transistor 112. In some embodiments, the doped regions 118A and 120 are heavily doped regions with a doping polarity which is different from that of the substrate 104. In the depicted embodiments, the doped regions 118A and 120 are n-type regions.

The gate stack of each transistor includes a gate dielectric layer and a gate electrode layer. The gate dielectric layer may include a dielectric material, such as silicon oxide, a high-k material, other dielectric materials, or combinations thereof. Examples of the high-k dielectric material may include $HfO_2$, HfSiO, HfSiO, HfTaO, HfTiO, HfZrO, zirconium oxide, aluminum oxide, hafnium oxide, hafnium dioxide-alumina ($HfO_2$—$Al_2O_3$) alloy or combinations thereof. The gate electrode layer may include polysilicon and/or a metal including Al, Cu, Ti, Ta, W, Mo, TaN, NiSi, CoSi, TiN, WN, TiAl, TiAlN, TaCN, TaC, TaSiN or combinations thereof.

The periphery region 102 may include readout and/or control circuitry coupled to the pixel region 101 to provide an operational environment for the pixel region 101. In the depicted embodiments, a PMOS transistor 122 and an NMOS transistor 124 are shown. The PMOS transistor 122 includes a gate stack 122A and source/drain regions 122B having p-type doping polarity formed in an n-type well 122C. The NMOS transistor 124 includes a gate stack 124A and source/drain regions 124B having n-type doping polarity formed in a p-type well 124C.

The image-sensor device 100 further includes various isolation features in the pixel region 101 and the peripheral region 102. For example, the image-sensor device 100 may include a number of dielectric isolation features 108 and a number of doped isolation features 128 formed in substrate 104 of the pixel region 101. The dielectric isolation features 108 include silicon oxide, silicon nitride, silicon oxynitride, other insulating material, or combination thereof. Each of the dielectric isolation features 108 has a depth $D_1$ ranging from about 500 Å to about 3000 Å. The formation of the dielectric isolation features 108 may include an etching process to etch trenches from the front surface 104A of the substrate 104 and a deposition process to fill the trenches with a dielectric material. In some embodiments, the dielectric isolation features 108 may be surrounded by a doped liner layer 126. The doped liner layer 126 may have a doping polarity which is different from that of the radiation-sensing region 106A. The doped liner layer 126 is able to remedy surface defects of the dielectric isolation features 108 after annealing.

In some embodiments, the doped isolation regions 128 extend from the front surface 104A into the substrate 104. The doped isolation features 128 have a doping polarity which is different from the radiation-sensing region 106A for acting as isolation wells. In the depicted embodiments, the doped isolation features 128 are p-type doped regions. The dielectric isolation features 108 and the doped isolation features 128 surround the radiation-sensing region 106A of the photodetector 106 to prevent horizontal leakage paths between the photodetector 106 and other regions. The image-sensor device 100 further includes a number of dielectric isolation features 130 formed in the peripheral region 102. Each of the dielectric isolation features 130 extends from the front surface 104A into the substrate 104. The dielectric isolation features 130 may isolate the PMOS transistor 122 and the NMOS transistor 124 in the peripheral region 102. The dielectric isolation features 130 may include silicon oxide, silicon nitride, silicon oxynitride, other insulating material, or combinations thereof.

In some embodiments, the image-sensor device 100 includes a doped layer 132 and a doped layer 134 formed near the back surface 104B of the substrate 104. The doped layer 132 is formed near the back surface 104B between the doped isolation features 128. The doped layer 134 has a doping polarity which is the same as the radiation-sensing region 106A and typically extends to the radiation-sensing region 106A. In the depicted embodiments, the doped layer 132 is an n-type layer. The doped layer 132 may have a doping concentration that is less than the doping concentration of the radiation-sensing region 106A. The doped layer 132 may create an electric field to help separate the electron-hole pairs and drive electrons to the radiation-sensing region 106A. In some embodiments, the doped layer 134 has a doping polarity which is different from the radiation-sensing region 106A to isolate the photodetector 106. In some embodiments, the doped layer 134 is formed by one or more implantation processes from the back surface 104B of the substrate 104.

The image-sensor device 100 further includes a multilayer interconnect (MLI) 136 over the front surface 104A of the substrate 104, including over the photodetector 106. The MLI 136 is coupled to various components of the image-sensor device 100, for example the photodetector 106, such that the various components of the image-sensor device 100 are operable to properly respond to illuminated light (imaging radiation). The MLI 136 includes various conductive features 138 and 140. The conductive features 138 may be vertical interconnects 138, such as contacts and/or vias, and the conductive features 140 may be horizontal interconnects, such as lines. The various conductive features 138 and 140 include conductive materials, such as aluminum, aluminum/silicon/copper alloy, titanium, titanium nitride, tungsten, polysilicon, metal silicide, or combinations thereof.

The various conductive features 138 and 140 of the MLI 136 are interposed in a dielectric layer 142. The ILD layer 142 may include silicon dioxide, silicon nitride, silicon oxynitride, TEOS oxide, phosphosilicate glass (PSG), borophosphosilicate glass nitride (BPSG), fluorinated silica glass (FSG), carbon doped silicon oxide, Black diamond® (Applied materials of Santa Clara, Calif.), amorphous fluorinated carbon, low-k dielectric material, polyimide, or combinations thereof. The ILD layer 142 may have a multilayer structure.

The image-sensor device 100 may further include a carrier wafer 144 disposed over the front surface 104A of the substrate 104. In some embodiments, the carrier wafer 144 is bonded to the MLI 136. The carrier wafer 144 includes silicon or glass. The carrier wafer 144 can provide protection for the various features (such as the photodetector) formed on the front surface 104A of the substrate 104, and can also provide mechanical strength and support for processing the back surface 104B of the substrate 104.

The image-sensor device 100 may further include an antireflective layer 146, a color filter 148 and a lens 150 disposed over the back surface 104 of the substrate 104. The antireflective layer 146 includes a dielectric material, such as silicon nitride or silicon oxynitride.

The color filter 148 is disposed over the antireflective layer 146, and is aligned with the radiation-sensing region 106A of the photodetector 106. The color filter 148 is designed so that it filters through light of a predetermined wavelength. For example, the color filter 148 may filter though visible light of a red wavelength, a green wavelength, or a blue wavelength to the photodetector 106. In an example, the color filter 148 includes a dye-based (or pigment-based) polymer for filtering out a specific frequency band (for example, a desired wavelength of light).

The lens 150 is disposed over the color filter 148 and is also aligned with the radiation-sensing region 106A of the photodetector 106. The lens 150 may be in various positional arrangements with the photodetector 106 and the color filter 148, such that the lens 150 focuses an incident radiation 152 on the radiation-sensing region 106A of the photodetector 106. Alternatively, the position of the color filter 148 and the lens 150 may be reversed, such that the lens 150 is disposed between the antireflective layer 146 and the color filter 148.

In an operation according to one or more embodiments, the image-sensor device 100 is designed to receive an incident radiation 152 traveling towards the back surface 104B of the substrate 104. The lens 150 directs the incident radiation 152 to the color filter 148. The incident radiation 152 then passes from the color filter 148 through the antireflective layer 146 to the substrate 104 and the corresponding photodetector 106, specifically to the radiation-sensing region 106A. When exposed to the incident radiation 146, the photodetector 106 responds to the incident radiation 152 by accumulating charges. When the gate of transfer transistor 110 is turned on, the charges are transferred from the photodetector 106 to the floating diffusion region 120. Through the connection of the conductive feature 132 (shown in FIG. 1), the source-follower transistor 114 may convert the charges from the floating diffusion region 120 to voltage signals. The select transistor 116 may allow a single row of the pixel array to be read by read-out electronics. The reset transistor 112 acts as a switch to reset the floating diffusion region 120. When the reset transistor 112 is turned on, the floating diffusion region 120 is effectively connected to a power supply, clearing all integrated charges. In the depicted embodiments, each of the transistors in the pixel region 101 keeps off when a bias voltage is not applied, and is turned on by applying a positive bias voltage.

As shown in FIG. 2, the photodetector 106 is surrounded by various doped regions, such as the doped liner layer 126, the doped isolation regions 128 and the doped layer 132. The doped layer 126 and 132 and the doped isolation regions 132 can prevent horizontal current leakage and enhance performance of the photodetector 106. However, the formation of the doped layers 126 and 132 and the doped isolation regions 128 may require high implant energies to implant dopants therein. Such high implant energies could cause damage in the image-sensor device 100, which may make dark current and white pixel issues worse. In addition, the doped layers 126 and 132 and the doped isolation regions 128 may require one or more annealing processes to activate the implanted dopants. A high temperature of each of the annealing processes could further cause diffusion of the doped regions and other doped regions in the substrate 104. Further diffusion of other doped regions could be detrimental to the performance and reliability of the image-sensor device 100.

Figure 3:
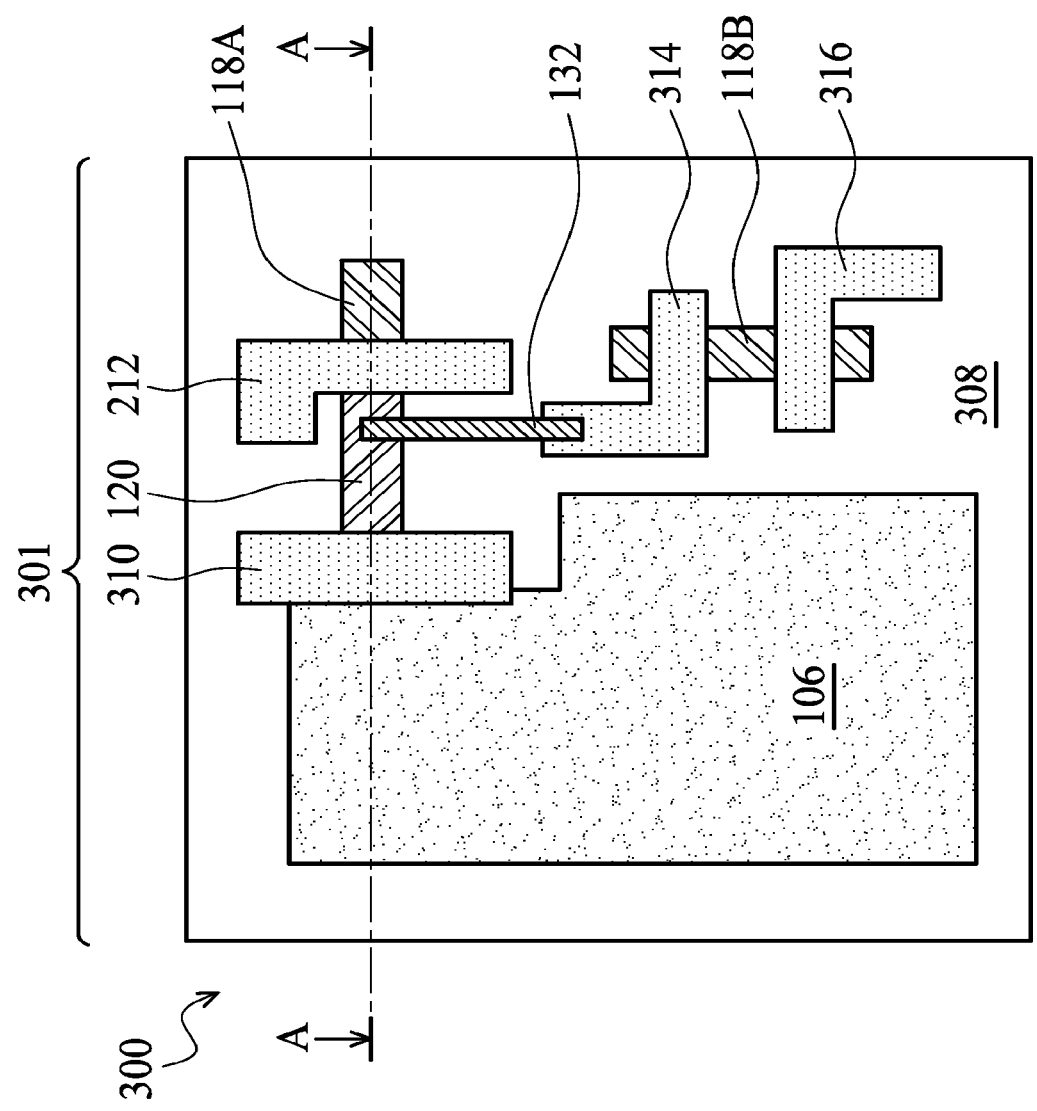
FIG. 3 shows an enlarged top view of a pixel region of an image-sensor device, in accordance with some embodiments.

FIG. 3 shows an enlarged top view of a pixel region 301 of an image-sensor device 300 (illustrated in FIGS. 5-9), in accordance with some embodiments. The image-sensor device 300 includes an array of pixels as shown in FIG. 3. Each pixel region 301 is arranged in a column and a row. In some embodiments, from the top view, the connections and arrangements of each feature in the image-sensor device 300 is the same as or similar with the corresponding features shown in FIG. 1. Accordingly, the connection and arrangement of the each feature in the image-sensor device 300 are not repeatedly discussed herein.

Figure 4:
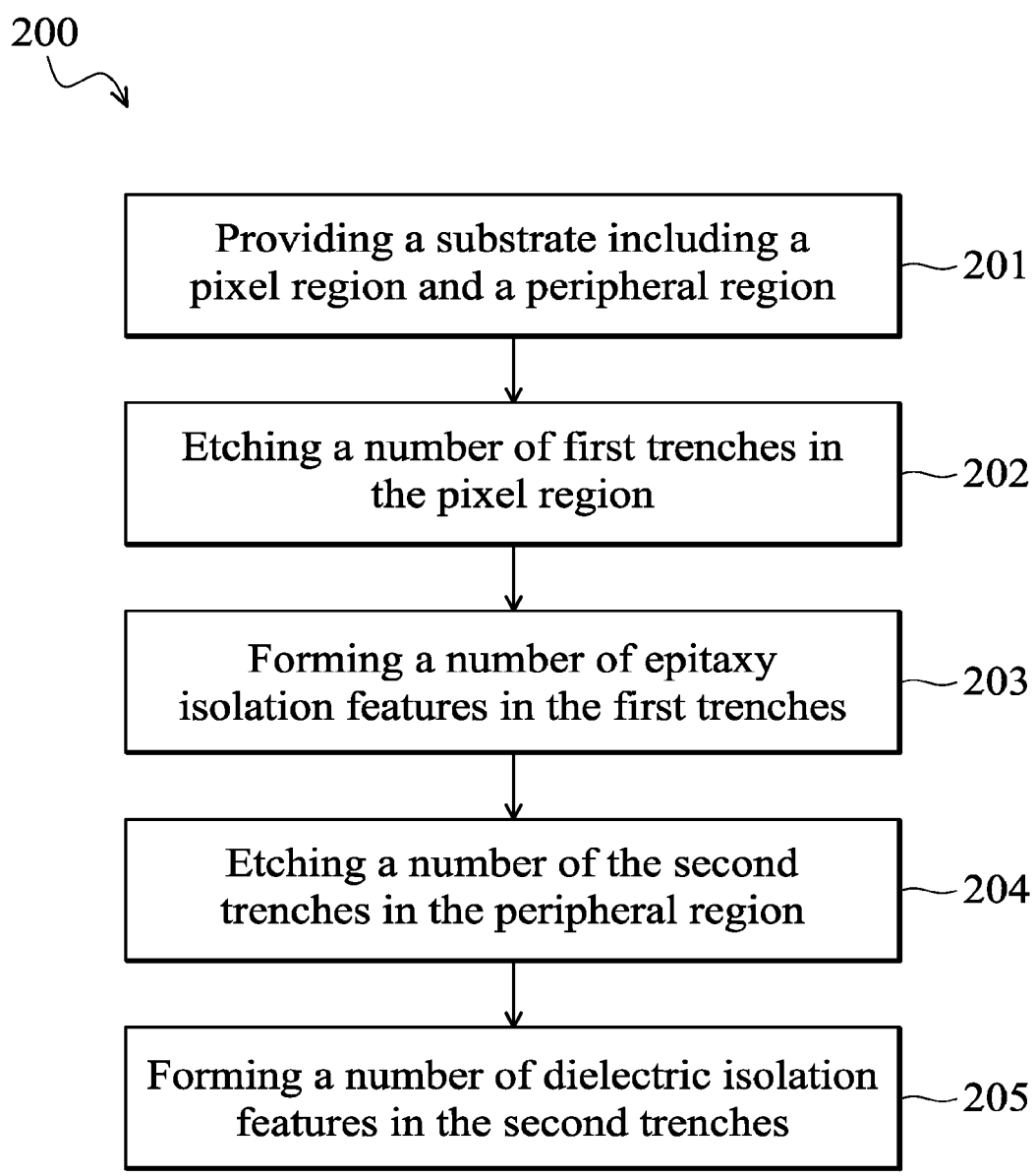
FIG. 4 shows a flow chart illustrating a method for manufacturing an image sensor device, in accordance with some embodiments.

FIG. 4 is a flow chart of a method 200 of forming an image-sensor device 300 according to some embodiments of this disclosure. The method 200 starts with operation 201, in which a substrate having a pixel region and a periphery region is provided. Afterwards, the method 200 continues with operation 202 in which a number of first trenches are etched in the pixel region. The method 200 continues with operation 203 in which a number of epitaxial isolation features are formed in the first trenches. Afterwards, the method continues 200 with operation 204 in which a number of second trenches are formed in the peripheral region. Afterwards, the method 200 continues with operation 205 in which a number of dielectric isolation features are formed in the second trenches.

FIGS. 5 to 9 are cross-sectional views of the pixel region 301 along line A-A in FIG. 3 and a peripheral region 302 of the image-sensor device 300 at various stages of the manufacturing process, in accordance with some embodiments. In some embodiments, the image-sensor device 300 is fabricated according to the method 200. Various figures have been simplified for a better understanding of the concepts of the present disclosure.

Figure 5:
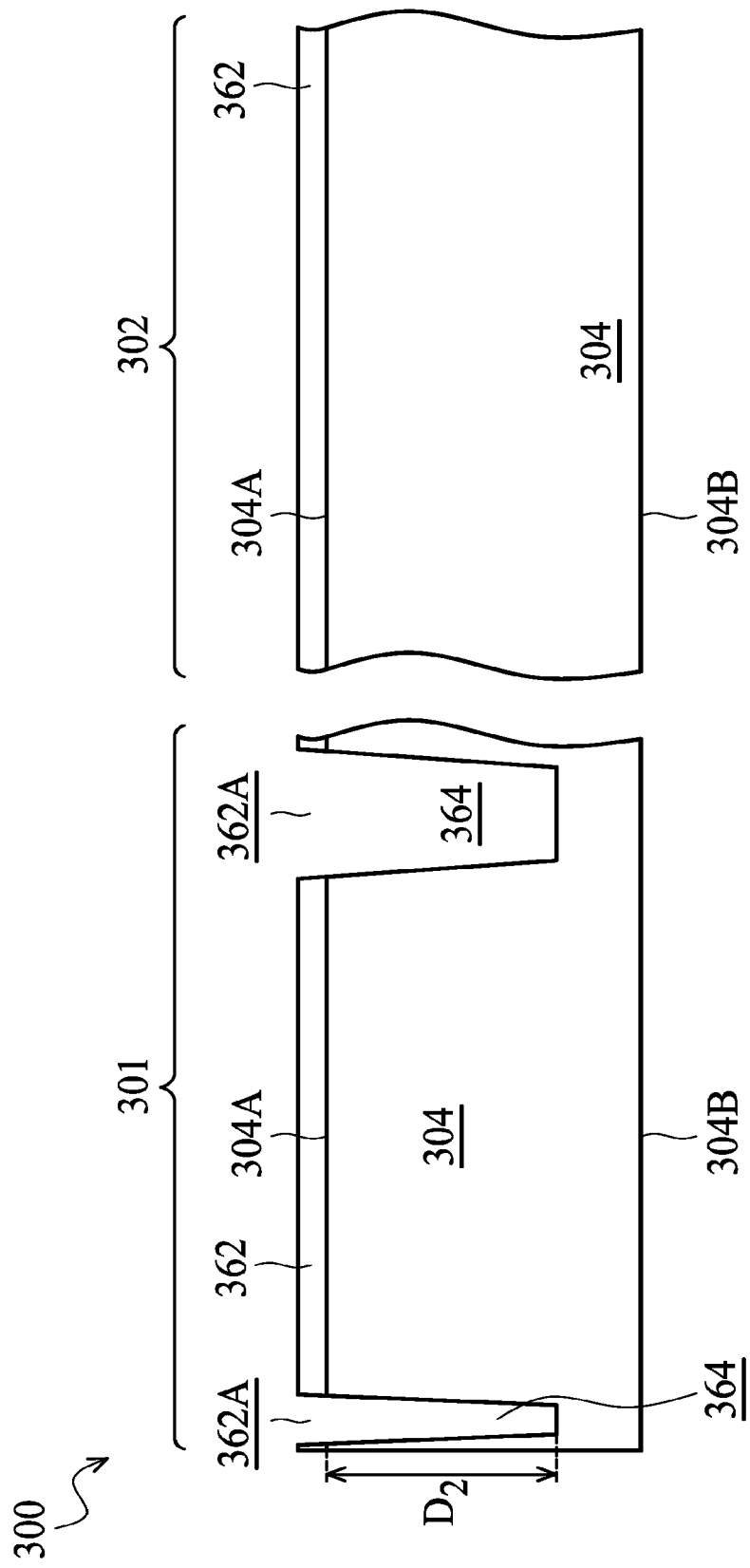
FIGS. 5-9 are cross-sectional views of a pixel region shown in FIG. 3 and a peripheral region of an image-sensor device at various stages of the manufacturing process, in accordance with some embodiments.

The method 200 proceeds from operation 201 and continues to operation 202. FIG. 5 is a cross-sectional view of the image-sensor device 300 after performing operations 201 and 202, in accordance with some embodiments. A substrate 304 is provided. The substrate 304 has a front surface 304A and a back surface 304B. The substrate 304 is similar with the substrate 104 as shown in FIG. 2 but has a doping polarity which is different from that of the substrate 104. For example, the substrate 304 has a first doping polarity that is n-type or p-type. The substrate 304 is an n-type substrate when the substrate 104 is a p-type substrate, or vice versa. In the depicted embodiments, the substrate 304 is an n-type substrate. In some embodiments, the substrate 304 may have a doping concentration ranging from about $1E15/cm^3$ to about $1E16/cm^3$.

In some embodiments, a hard mask layer 362 is formed over the front surface 304A of the substrate 304. The hard mask layer 362 may have a multilayer structure. In some embodiments, the hard mask layer 362 includes a pad layer (not shown), a dielectric layer (not shown) over the pad layer, and an imaging enhancement layer (not shown) over the dielectric layer. The pad layer, such as an oxide layer, act as a stress buffer layer between the substrate 304 and the overlying dielectric layer. The dielectric layer may include a nitrogen-containing material, such as silicon nitride or silicon oxynitride. Alternatively, the dielectric layer includes an amorphous carbon material, silicon carbide or tetraethylorthosilicate (TEOS). The imaging enhancement layer may include an organic layer, or a polymer layer or silicon-rich oxide (SRO). The imaging enhancement layer can enhance the accuracy of an image being transferred from an overlying photoresist layer. The hard mask layer 362 may be formed through a process such as a chemical vapor deposition (CVD) or plasma enhanced chemical vapor deposition (PECVD). Then, the hard mask layer 362 is patterned through suitable photolithographic and etching processes to form a number of holes 362A and expose a portion of the front surface 304A of the substrate 304 in the pixel region 301.

The exposed portion of the substrate 304 are removed by a suitable etching process through the holes 362A to form a number of first trenches 364 in the pixel region 301. The etching process may be reactive ion etching (REI) or other dry etching processes. A depth $D_2$ of each of the first trenches 364 may be in a range from about 2000 Å to about 5000 Å.

Figure 6:
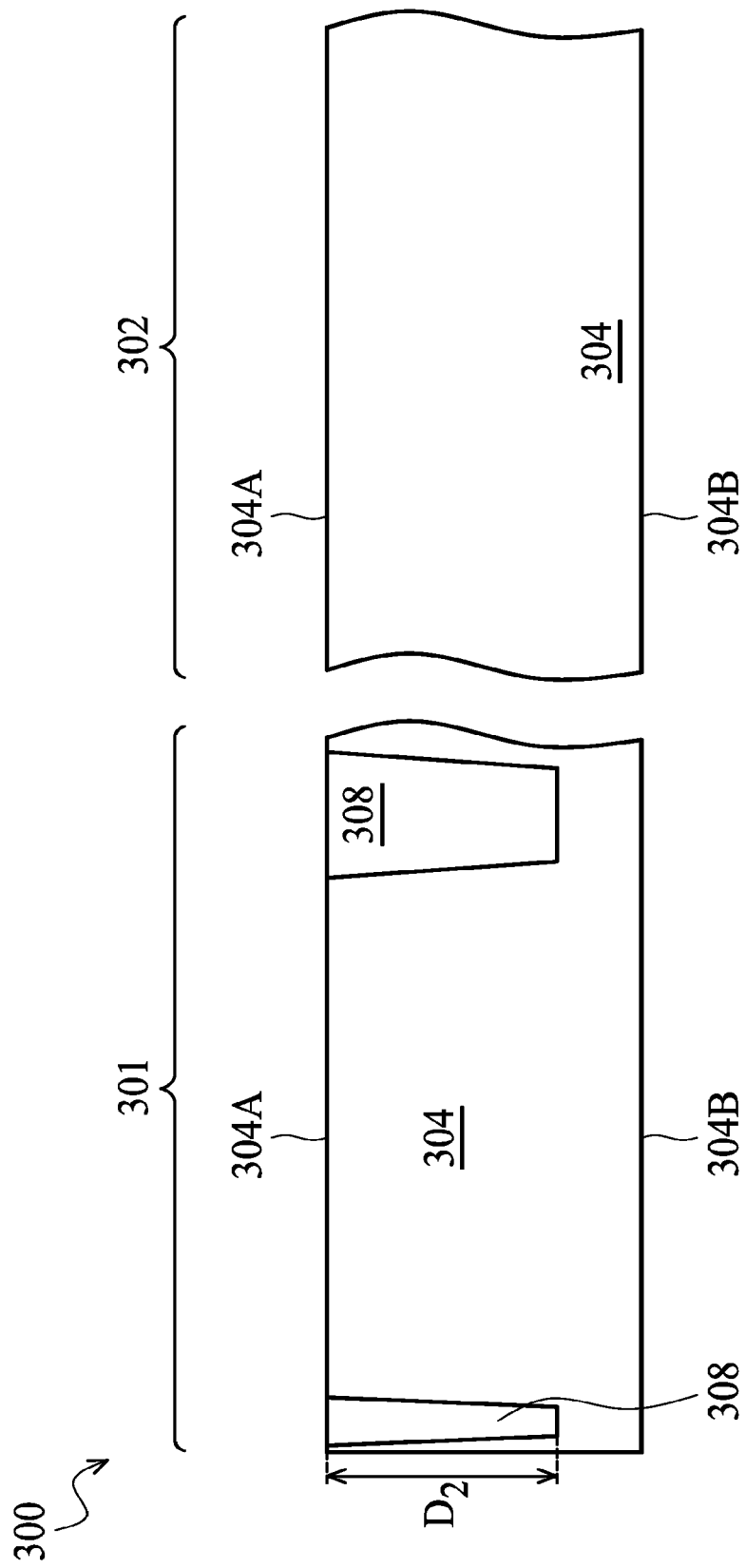

The method 200 continues with operation 203 in which epitaxial isolation features are formed in the first trenches. FIG. 6 is a cross-sectional view of the image-sensor device 300 after performing operation 203, in accordance with some embodiments. A number of epitaxial isolation features 308 are formed in the first trenches 362. Each of the epitaxial isolation features 308 may have the depth $D_2$. In some embodiments, an epitaxy process is performed to deposit an epitaxy material. The epitaxial material is formed by epitaxially growing a semiconductor material. The semiconductor material may include single elements such as germanium (Ge) or silicon (Si), or compound semiconductor materials, such as gallium arsenide (GaAs), aluminum gallium arsenide (AlGaAs), or semiconductor alloy, such as silicon germanium (SiGe), gallium arsenide phosphide (GaAsP). The epitaxial growing process may include selective epitaxy growth (SEG), cyclic deposition and etching (CDE), chemical vapor deposition (CVD) techniques (e.g., vapor-phase epitaxy (VPE) and/or ultra-high vacuum CVD (UHV-CVD)), molecular beam epitaxy (MBE), other suitable epitaxy processes, or combinations thereof.

Each of the epitaxial isolation features 308 has a second doping polarity which is different from the first doping polarity. In the depicted embodiments, the epitaxial isolation features 308 are p-type epitaxial isolation features. In some embodiments, the doping concentration of the epitaxial isolation features 308 is in a range from about $1E17$ per $cm^3$ to about $1E18$ per $cm^3$. The epitaxial isolation features 308 may be doped through in-situ doping as the material is grown such that there is no need to further perform another implant process and annealing process to activate the implanted dopant. In some embodiments, each of the epitaxial isolation features 308 has a gradient doping concentration. For example, the doping concentration of the epitaxial isolation features 308 increases toward the front surface 304A of the substrate 304. Such gradient doping concentration may effectively isolate the heavily doped regions of the transistors (shown in FIG. 3) formed near the front surface 304A.

The epitaxy material may overfill the first trenches 362. A planarization process, such as a chemical mechanical polishing (CMP) process and/or an etching process, is applied to the epitaxy material to reduce the thickness of the epitaxy material to expose the top surface of the hard mask layer 362. In some embodiments, the hard mask layer 362 is removed after the planarization process. The epitaxial isolation features 308 are further planarized until they are substantially planar to the front surface 304A of the substrate 304.

Figure 7:
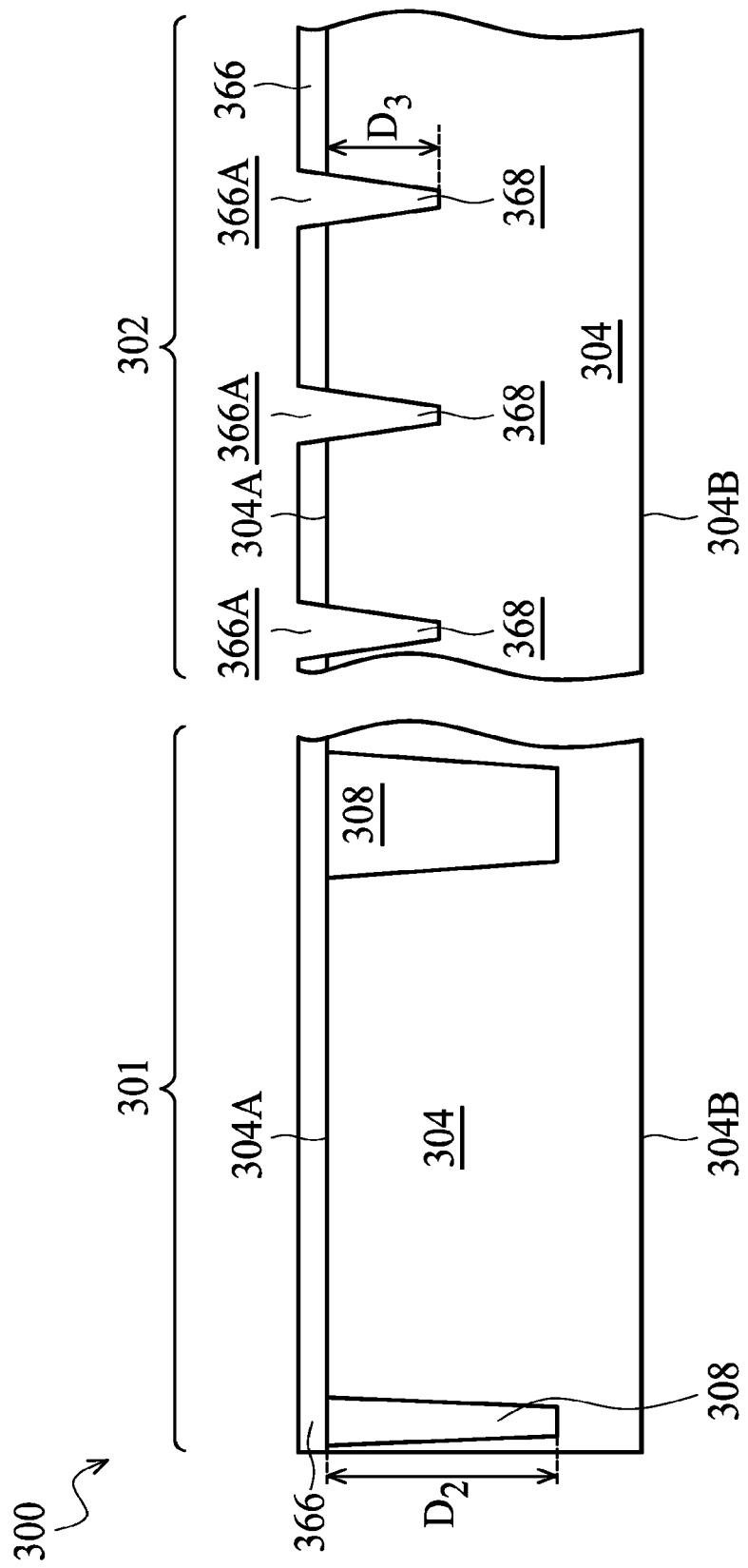

The method 200 continues with operation 204 in which a number of second trenches are etched into the substrate 304 of the peripheral region 302. FIG. 7 shows a cross-sectional view of the image-sensor device 300 after performing operation 204, in accordance with some embodiments. A hard mask layer 366 is formed over the front surface 304A of the substrate 304. The hard mask layer 366 may include a multilayer structure and material which are similar with the hard mask layer 362. Afterwards, the hard mask layer 366 is patterned through suitable photolithographic and etching processes to form a number of holes 366A. The holes 366A expose a portion of the front surface 304A of the substrate 304 in the peripheral region 302.

The exposed portion of the substrate 304 is removed by a suitable etching process through the holes 366A to form a number of second trenches 368 in the peripheral region 302. The etching process may include reactive ion etching (RIE) or other dry etching techniques. Each of the second trenches has a depth $D_3$ extending from the front surface 304A into the substrate 304. The depth $D_3$ may be substantially the same with the depth $D_1$.

Figure 8:
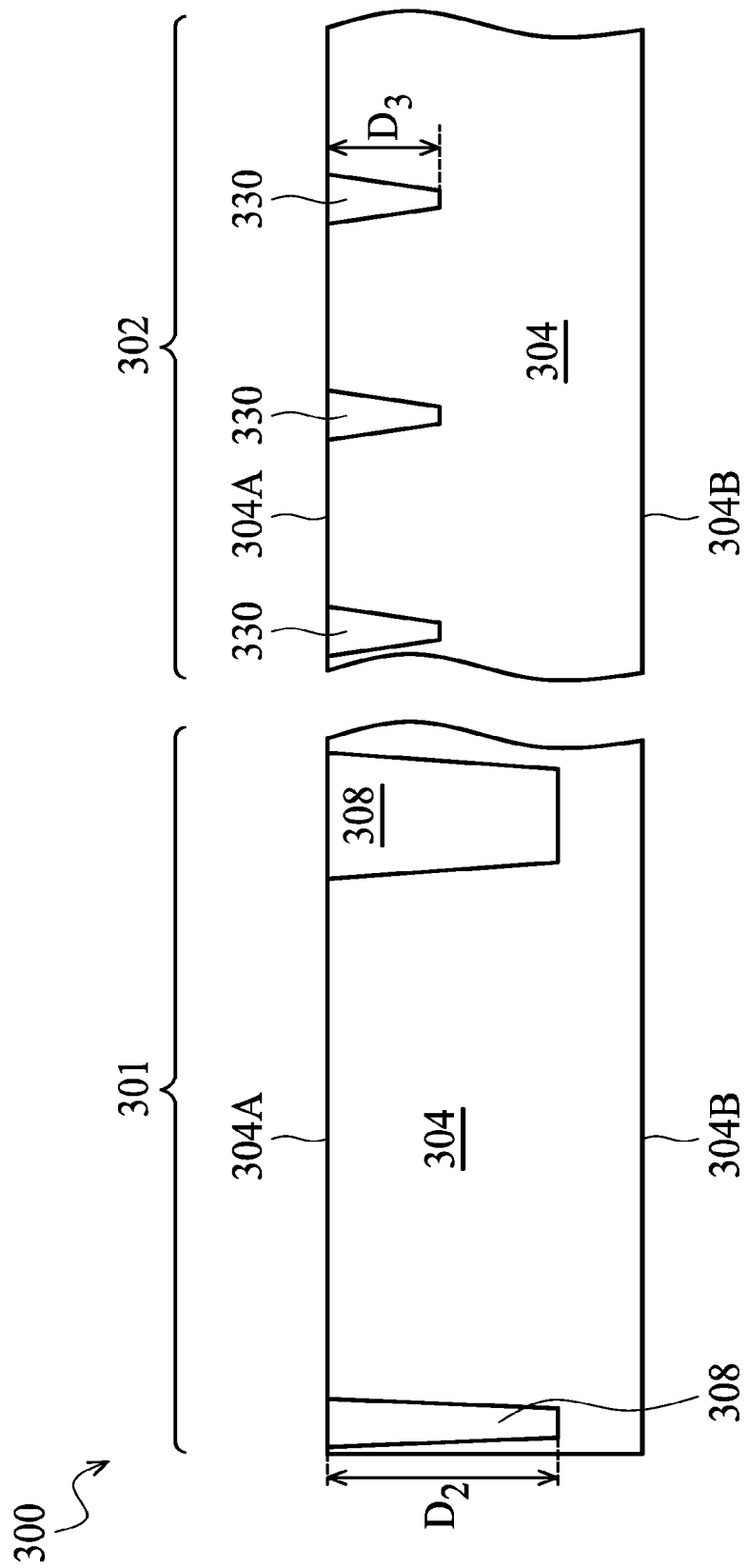

The method 200 continues with operation 205 in which a number of dielectric isolation features are formed in the second trenches. FIG. 8 shows a cross-sectional view of the image-sensor device 300 after performing operation 205. As shown in FIG. 8, a number of dielectric isolation features 330 are formed in the second trenches 368. In some embodiments, a dielectric material is deposited into the second trenches 368 by a suitable deposition process. The deposition process may include chemical vapor deposition (CVD), physical vapor deposition (PVD), plasma enhanced chemical vapor deposition (PECVD) or other suitable deposition methods. The dielectric material may include silicon oxide, silicon nitride, silicon oxynitride, other insulating material, or combinations thereof.

The dielectric material may overfill the second trenches 368. A planarization process, such as a chemical mechanical polishing (CMP) process and/or an etching process, is applied to the dielectric material to expose the top surface of the hard mask layer 366. In some embodiments, the hard mask layer 366 is removed after the planarization process. The dielectric isolation features 330 are further planarized until they are substantially planar to the front surface 304A of the substrate 304.

Figure 9:
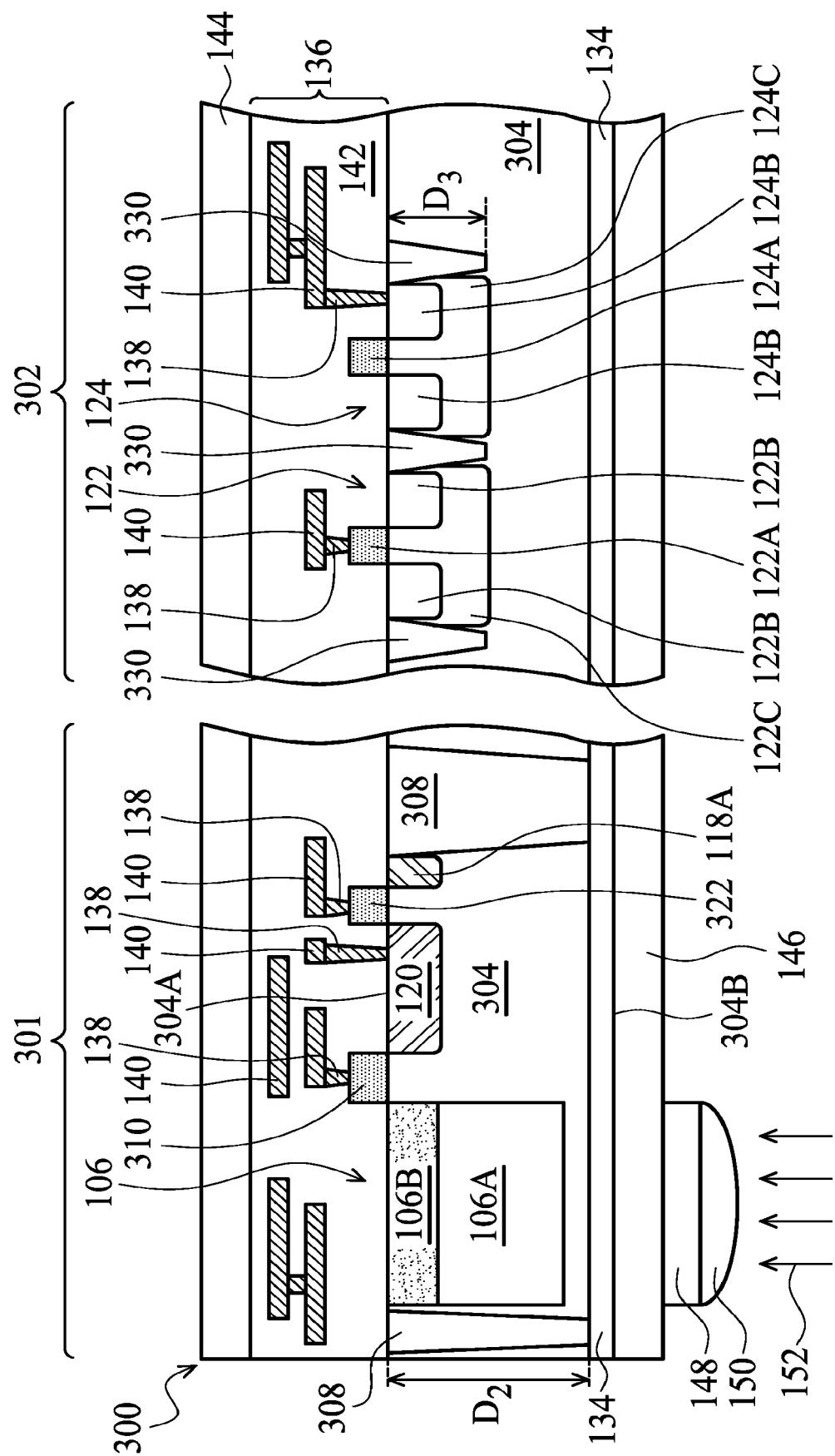

It is understood that additional operations can be provided before, during and after operation 205 of the method 200. FIG. 9 is a cross-sectional view of the image-sensor device 300 after operation 205. The photodetector 106 is formed in the pixel region 301. The photodetector 106 includes the radiation-sensing region 106A and the pinned layer 106B. The radiation-sensing region 106A is surrounded by the epitaxial isolation features 308. The depth of the epitaxial isolation features is greater than that of the radiation-sensing region 106A. In some embodiments, the radiation-sensing region 106A also has a doping polarity, such as the first doping polarity, which is the same as the substrate 304 and different from the epitaxial isolation features 308. Accordingly, the epitaxial isolation features 308 may form a P-N junction with the radiation-sensing region 106A to prevent lateral current leakage. In the depicted embodiments, the radiation-sensing region 106A is doped with n-type species along the front surface 304A of the substrate 304. The pinned layer 106B is doped with p-type species overlapping in the radiation-sensing region 106A at the front surface 304A of the substrate 304. In some embodiments, the radiation-sensing region 106A has a doping concentration greater than that of the substrate 304. For example, the radiation-sensing region 106A may have a doping concentration ranging from about 1E15 per $cm^3$ to about 1E16 per $cm^3$.

As shown in FIG. 9, by forming the epitaxial isolation features 308, there is no need to form the dielectric features 108 (shown in FIG. 2), the doped liner layer 126 (shown in FIG. 2) and the doped isolation feature 128 (shown in FIG. 2). In addition, there is also no need to form the doped layer 132 (as shown in FIG. 2). The substrate 304 can provide the same function as the doped layer 132 since it has the same doping polarity (e.g., the first doping polarity) as the radiation-sensing region 106A. Therefore, high implant energies and a number of annealing processes can be eliminated in the manufacturing process of the image-sensor device 300.

The floating diffusion region 120 and the doped regions 118A and 118B (shown in FIG. 3) are formed in the pixel region 301. The floating diffusion region 120 and the doped regions 118A and 118B may be heavily doped regions of the first doping polarity. For example, the floating diffusion region 120 and the doped regions 118A and 118B may have a doping concentration ranging from about 1E15 per $cm^3$ to about 8E15 per $cm^3$. In the depicted embodiments, the floating diffusion region 120 and the doped regions 118A and 118B are n-type doped regions.

In the periphery region 102, an n-type well 122C and a p-well 124C are formed in the substrate 104 by implantation. Source/drain regions 122B and source/drain regions 124B are formed in the corresponding n-type well 122C and p-well 124 by implantation.

Gate stacks are formed on the front surface 304A of the substrate 304 and in the pixel region 301 and peripheral region 302. Each of the gate stacks includes a gate dielectric layer and a gate electrode layer. The gate stacks and the doped regions 120, 118A and 118B (shown in FIG. 3) construct a transfer transistor 310, a reset transistor 312, a source-follower transistor 314 (shown in FIG. 3) and a select transistor 316 (shown in FIG. 3) in the pixel region 102. As described above, in some embodiments, each of the substrate 304 and the doped regions 120, 118A and 118B has the first doping polarity. Accordingly, the channel portions of each of the transistors 310, 312, 314 and 316 in the pixel region 301 have the same doping polarity as the doped regions 120, 118A and 118B with less doping concentration. In some embodiments, each of the transistors 310, 312, 314 and 316 keeps off by applying a negative bias voltage, and is turned on by applying a positive bias voltage or stopping to apply the negative bias voltage. For example, the negative bias voltage is in a range from about 3.3 to about −3.3 V.

The gate stacks 122A and 124A corresponding to the n-type well 122C and the p-well 124C are formed in the periphery region 102. The gate stacks 122A and source/drain regions 122B in the n-type well 122C construct a PMOS transistor. Likewise, the gate stacks 124A and source/drain regions 124B in the p-type well 124C construct a NMOS transistor. The gate stacks in the pixel region 310 and the peripheral region 302 are formed by suitable processes, including deposition, lithography patterning, and etching processes.

The image-sensor device 300 further includes a multilayer interconnect (MLI) 136 disposed over the front surface 304A of the substrate 304. The MLI 136 is coupled to various components of the image-sensor device 300, such as the photodetector 106, such that the various components of the image sensor device 100 are operable to properly respond to illuminated light (imaging radiation). The MLI 136 includes various conductive features 138 and 140, which may be vertical interconnects, such as contacts and/or vias and horizontal interconnects, such as lines. The conductive features 138 and 140 are formed by suitable processes, including deposition, lithography patterning, and etching processes to form vertical and horizontal interconnects.

The various conductive features 138 and 140 of the MLI 136 are disposed in an interlayer dielectric (ILD) layer 142. The ILD layer 142 may include silicon dioxide, silicon nitride, silicon oxynitride, TEOS oxide, phosphosilicate glass (PSG), borophosphosilicate glass (BPSG), fluorinated silica glass (FSG), carbon doped silicon oxide, low-k dielectric material, or combinations thereof. The ILD layer 142 may have a multilayer structure. The ILD layer 142 may be formed by suitable processes, including spin-on coating, chemical vapor deposition (CVD) or plasma enhanced chemical vapor deposition (PECVD). In one example, the MLI 136 and the ILD layer 142 may be formed in an integrated process including a damascene process. In some embodiments, further process steps are included after the MLI 136 formation. As illustrated in FIG. 9, the carrier wafer 144 is bonded to the MLI 136. The carrier wafer 146 provides mechanical strength and support for processing the back surface 304B of the substrate 304. A planarization process, such as a chemical mechanical polishing (CMP) process, is applied to the back surface 304B of the substrate 304 to reduce a thickness of the substrate 304. The doped layer 134 is formed by an implantation process, diffusion process, annealing process or combinations thereof through the back surface 304B. The antireflective layer 146, the color filter 148 and the lens 150 disposed over the back surface 304b of the substrate 304 are also formed, in some embodiments. The color filter 348 and the lens 350 are aligned with the radiation-sensing region 106A of the photodetector 106.

Although the impurity type of the substrate (such as 104, 304) and the doped regions (such as regions 106A, 106B, 126, 118A, 118B, 120, 122B, 122C, 124B, 124C, 126, 128, 132, 134, 308, etc.) are specified in the illustrated embodiments, the teaching of the embodiments is readily available for the formation of a device with doping polarities of the substrate and these doped regions inverted. In addition, the sequences of the operations 201 to 205 may be reasonably rearranged. For example, the operations 204 and 205 can be performed prior to the operations 202 and 203.

Embodiments of mechanisms for forming an image-sensor device are described above. The image-sensor device including epitaxial isolation features are formed to prevent horizontal current leakage. The epitaxial isolation features may be formed without an annealing process. In addition, the image-sensor device includes a substrate that is doped with the same doping polarity as a radiation-sensing region. The substrate itself can provide a function to create an electric field to help separate the electron-hole pairs and drive electrons to the radiation-sensing region. There is no need to form another doped layer near the back surface of the substrate. Accordingly, high energy implantation and a number of annealing processes can be avoided in the manufacturing process of the image-sensor device. The performance and reliability of the image-sensor device can be enhanced.

In accordance with some embodiments, an image-sensor device is provided. The image-sensor device includes a substrate having a front surface and a back surface. The image-sensor device also includes a radiation-sensing region, and the radiation-sensing region is operable to detect incident radiation that enters the substrate through the back surface. The image-sensor device further includes a doped isolation region formed in the substrate and adjacent to the radiation-sensing region. In addition, the image-sensor device includes a deep-trench isolation structure formed in the doped isolation region. The deep-trench isolation structure includes a trench extending from the back surface and a negatively charged film covering the trench.

In accordance with some embodiments, an image-sensor device is provided. The image-sensor device includes a substrate having a front surface and a back surface. The image-sensor device also includes a radiation-sensing region formed in the substrate. The radiation-sensing region is operable to detect incident radiation that enters the substrate through the back surface. The radiation-sensing region further includes an epitaxial isolation feature formed in the substrate and adjacent to the radiation-sensing region. The radiation-sensing region and the epitaxial isolation feature have different doping polarities.

In accordance with some embodiments, an image-sensor device is provided. The image-sensor device includes a substrate having a front surface and a back surface, and the substrate has a first doping polarity. The image-sensor device also includes a radiation-sensing region formed in the substrate. The radiation-sensing region is operable to detect incident radiation that enters the substrate through the back surface. The radiation-sensing region has the first doping polarity and a doping concentration which is higher than that of the substrate. The image-sensor device further includes a heavily doped region formed in the substrate and adjacent to the radiation-sensing region. The heavily doped region has the first polarity and a doping concentration which is higher than that of the substrate. The heavily doped region and the radiation-sensing region define a channel region of the first polarity therebetween.

In accordance with some embodiments, an image-sensor device is provided. The method includes providing a substrate having a front surface and a back surface. The method also includes forming a radiation-sensing region of a first doping polarity in the substrate. The method further includes forming an epitaxial isolation structure in the substrate and adjacent to the radiation-sensing region. The epitaxial isolation structure has a second doping polarity which is different from the first doping polarity.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and operations described in the specification. As one of ordinary skill in the art will readily appreciate from the disclosure of the present disclosure, processes, machines, manufacture, compositions of matter, means, methods, or operations, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or operations.

What is claimed is:

1. A device, comprising:
   a substrate having a front surface and a back surface, the substrate including a first region having a first doping polarity and a second region;
   a first device disposed in the first region;
   a first isolation feature comprising semiconductor material of a second doping polarity, which is opposite the first doping polarity, disposed in the substrate and surrounding the first region;
   a second device disposed in or over the second region;
   a second isolation feature disposed in the substrate and surrounding the second device; and
   a doped region having the first doping polarity and extending continuously under the first region and the second region, wherein the doped region .s has an uppermost surface in direct contact with a bottom surface of the first isolation feature and is spaced apart from a bottom surface of the second isolation feature.

2. The device of claim 1, wherein the first region includes a radiation-sensing region that is doped to have a same doping polarity as the doped region.

3. The device of claim 2, further comprising:
   an anti-reflective layer directly contacting a bottom surface of the doped region; and
   a microlens structure disposed beneath a bottom surface of the anti-reflective layer, the microlens structure being aligned under the radiation-sensing region.

4. The device of claim 1, wherein the first device comprises a photodiode disposed in the substrate, the photodiode being surrounded by the first isolation feature.

5. The device of claim 4, wherein the second device comprises a logic transistor, the logic transistor being surrounded by the second isolation feature.

6. An image-sensor device, comprising:
a substrate having a front surface and a back surface, the substrate including a pixel region and a logic region, the pixel region having a first doping polarity;
a logic transistor disposed in or over the logic region and being surrounded by a logic isolation feature;
a radiation-sensing region disposed in the pixel region and being surrounded by an epitaxial pixel isolation feature, the epitaxial pixel isolation feature having a second doping polarity opposite the first doping polarity; and
a doped region extending continuously under the pixel region and the logic region, wherein the doped region is has an uppermost surface in direct contact with a bottom surface of the epitaxial pixel isolation feature, has the first doping polarity, and is spaced apart from a bottom surface of the logic isolation feature.

7. The image-sensor device of claim 6, wherein the doped region has a same doping polarity as the radiation-sensing region.

8. The image-sensor device of claim 6, wherein the epitaxial pixel isolation feature has a depth which is greater than that of the radiation-sensing region.

9. The image-sensor device of claim 6, wherein the epitaxial pixel isolation feature comprises Ge, Si, GaAs, AIGaAs, SiGe, GaAsP or combinations thereof.

10. The image-sensor device of claim 6, wherein the epitaxial pixel isolation feature has a doping concentration that increases toward the front surface of the substrate.

11. The image-sensor device of claim 6, wherein the doping concentration of the substrate is less than that of the radiation-sensing region.

12. The image-sensor device of claim 6, further comprising:
an anti-reflective layer directly contacting a bottom surface of the doped region; and
a microlens structure disposed beneath a bottom surface of the anti-reflective layer, the microlens structure being aligned under the radiation-sensing region.

13. An image-sensor device, comprising:
a substrate having a front surface and a back surface, the substrate including a pixel region and a logic region, the pixel region having a first doping polarity;
an anti-reflective layer contacting the back surface of the substrate;
a doped region of a single conductivity type of the first doping polarity located proximate to the back surface of the substrate and extending continuously under the pixel region and the logic region;
a logic isolation feature surrounding the logic region; and
a pixel isolation feature surrounding the pixel region, the pixel isolation feature having a second doping polarity opposite the first doping polarity;
wherein a bottom surface of the pixel isolation feature is in direct contact with a top surface the doped region and a bottom surface of the logic isolation feature is spaced apart from the top surface of the doped region; and
wherein a bottom surface of the doped region is in direct contact with the anti-reflective layer.

14. The image-sensor device of claim 13, further comprising a color filter layer and a lens formed over the back surface of the substrate.

15. The image-sensor device of claim 13, wherein the pixel isolation feature has a doping concentration that increases toward the front surface of the substrate.

16. The image-sensor device of claim 13, further comprising:
a logic transistor disposed in or on the logic region of the substrate; and
a radiation-sensing region disposed in the pixel region of the substrate.

17. The image-sensor device of claim 16, further comprising:
a heavily doped region in the pixel region of the front surface of the substrate and being spaced apart from the radiation-sensing region by a channel region;
a gate dielectric overlying channel region; and
a gate electrode overlying the gate dielectric.

18. The image-sensor device of claim 16, wherein the substrate and the radiation-sensing region have the same doping polarity.

19. The image-sensor device of claim 16, wherein a doping concentration of the substrate is less than that of the radiation-sensing region.

20. The image-sensor device of claim 16, wherein the pixel isolation feature is an epitaxial pixel isolation feature.

* * * * *